(12) United States Patent
Gann

(10) Patent No.: US 7,174,627 B2
(45) Date of Patent: Feb. 13, 2007

(54) METHOD OF FABRICATING KNOWN GOOD DIES FROM PACKAGED INTEGRATED CIRCUITS

(75) Inventor: Keith D. Gann, Tustin, CA (US)

(73) Assignee: Irvine Sensors Corporation, Costa Mesa, CA (US)

( * ) Notice: Subject to any disclaimer, the term of this patent is extended or adjusted under 35 U.S.C. 154(b) by 0 days.

(21) Appl. No.: 10/338,974

(22) Filed: Jan. 9, 2003

(65) Prior Publication Data

US 2003/0094704 A1 May 22, 2003

Related U.S. Application Data

(63) Continuation-in-part of application No. 09/770,864, filed on Jan. 26, 2001, now abandoned.

(60) Provisional application No. 60/346,494, filed on Jan. 9, 2002.

(51) Int. Cl.
*H01R 43/00* (2006.01)

(52) U.S. Cl. .............................. 29/827; 29/855; 29/840; 29/841; 29/843; 228/180.21; 438/15; 438/119; 257/686

(58) Field of Classification Search .................. 29/825, 29/829–834, 840–847, 852, 859; 257/686, 257/777, 782–784, E21.508; 324/765; 438/15, 438/106, 108–119, 613
See application file for complete search history.

(56) References Cited

U.S. PATENT DOCUMENTS

| | | | |
|---|---|---|---|
| 4,028,722 A | 6/1977 | Helda | |
| 4,889,612 A | 12/1989 | Geist et al. | |
| 4,989,063 A | 1/1991 | Kolesar, Jr. | |
| 4,994,215 A | 2/1991 | Wiech, Jr. | |
| 5,008,213 A | 4/1991 | Kolesar, Jr. | |
| 5,086,018 A | 2/1992 | Conru et al. | |
| 5,111,278 A | 5/1992 | Eichelberger | |
| 5,270,673 A | 12/1993 | Fries et al. | |
| 5,280,192 A | 1/1994 | Kryzaniwsky | |
| 5,291,061 A | 3/1994 | Ball | |
| 5,454,160 A | 10/1995 | Nickel | |
| 5,466,634 A | 11/1995 | Beilstein, Jr. et al. | |
| 5,502,621 A | 3/1996 | Schumacher et al. | |
| 5,502,667 A | 3/1996 | Bertin et al. | |
| 5,530,292 A | 6/1996 | Waki et al. | |
| 5,585,600 A | 12/1996 | Froebel et al. | |
| 5,585,668 A | 12/1996 | Burns | |

(Continued)

*Primary Examiner*—Minh Trinh
(74) *Attorney, Agent, or Firm*—McDermott Will & Emery LLP

(57) ABSTRACT

A known good die is economically fabricated. A tested integrated circuit is provided which includes a die having a bonding location on an upper surface and a lead. An upper portion of the integrated circuit package is removed or ground away to expose the bonding location. The lead is removed leaving the die and exposed bonding location to provide a known good die. The backside portion of the integrated circuit package is removed or ground away to expose the backside of the die. A contact pad is disposed on the bonding location. The bonding wire and exterior lead are also removed or ground away. The upper portion of the bonding ball is removed to provide a flattened bonding location. Preferably, the tested integrated circuit package provided is a thin small outline integrated circuit package (TSOP), and advantageously may be a packaged flash memory integrated circuit.

12 Claims, 2 Drawing Sheets

U.S. PATENT DOCUMENTS

| | | |
|---|---|---|
| 5,699,234 A | 12/1997 | Saia et al. |
| 5,700,697 A | 12/1997 | Dlugokecki |
| 5,701,233 A | 12/1997 | Carson et al. |
| 5,703,400 A | 12/1997 | Wojnarowski et al. |
| 5,739,581 A | 4/1998 | Chillara et al. |
| 5,778,520 A | 7/1998 | Kim et al. |
| 5,836,071 A | 11/1998 | Falcone et al. |
| 6,028,352 A * | 2/2000 | Eide .................... 257/686 |
| 6,060,373 A | 5/2000 | Saitoh |
| 6,080,262 A | 6/2000 | Wang |
| 6,103,553 A * | 8/2000 | Park .................... 438/119 |
| 6,140,695 A | 10/2000 | Tandy |
| 6,307,256 B1 | 10/2001 | Chiang et al. |
| 6,342,398 B1 | 1/2002 | Lin |
| 6,368,886 B1 | 4/2002 | Van Broekhoven et al. |
| 6,429,028 B1 | 8/2002 | Young et al. |
| 6,440,835 B1 | 8/2002 | Lin |
| 6,630,369 B2 | 10/2003 | Rubin |
| 6,706,971 B2 * | 3/2004 | Albert et al. .......... 174/255 |
| 6,818,980 B1 * | 11/2004 | Pedron, Jr. ............ 257/706 |
| 2002/0100600 A1 | 8/2002 | Albert et al. |
| 2003/0094704 A1 * | 5/2003 | Gann ..................... 257/782 |

* cited by examiner

METHOD OF FABRICATING KNOWN GOOD DIES FROM PACKAGED INTEGRATED CIRCUITS

RELATED APPLICATIONS

The present application is related to U.S. Provisional Patent Application Ser. No. 60/346,494, filed on Jan. 9, 2002, which is incorporated herein by reference and to which priority is claimed pursuant to 35 USC 119, and is a continuation-in-part of U.S. patent application Ser. No. 09/770,864, filed on Jan. 26, 2001, which is now abandoned and herein incorporated by reference.

BACKGROUND OF THE INVENTION

1. Field of the Invention

The invention relates to the field of the fabrication of integrated circuit dies and in particular to dies which have been tested and determined to be good.

2. Description of the Prior Art

In some applications the starting product is an integrated circuit die, i.e. a semiconductor chip with finished devices in the chip, but without leads or any packaging. The manufacture of dense electronic packaging is one such application. See U.S. Pat. Nos. 5,953,588 and 6,072,234, incorporated herein by reference, in which multichip modules MCMs are described. Because of the high demand for dies and the high capital investment necessary to be a mass manufacturer of them, it is difficult economically to induce a mass fabricator of dies to manufacture only dies as opposed to the usual finished product, which is a packaged or encapsulated integrated circuit. Such mass fabricators are typically fully occupied with the manufacture of finished integrated circuits. Chips are not typically offered for sale either in wafer or in die form.

Even in those cases where a mass fabricators can be induces to manufacture and sell a bare functional die, the dies are delivered in wafers or diced without testing. In other words, normally a die is tested after it is connected to its lead frame and packaged to ascertain whether it is operable as intended. Mass testing of bare dies is not a procedure that many or any mass fabricators are equipped to do. Therefore, a purchaser of bare dies must test each die individually himself in order to determine its operability or the yield. Bare die testing is too limited to ensure acceptable yields, while comprehensive testing and burn-in renders bare die production cost ineffective. These problems are known as the Know Good Die or KGD problem.

What is needed is some type of method whereby known good bare dies can be economically and practically obtained.

BRIEF SUMMARY OF THE INVENTION

The illustrated embodiment of the invention is a method for providing a known good die comprising the steps of providing a tested integrated circuit package including a die having at least one bonding location on an upper surface of the die and a corresponding lead extending from the bonding location. An upper portion of the integrated circuit package is removed to expose the bonding location. The lead is removed thereby leaving the die and exposed bonding location to provide a known good die.

The die has a backside and the method further comprises the step of removing a backside portion of the integrated circuit package to expose the backside of the die.

The method may further comprise the step of disposing a contact pad on the bonding location.

The die includes a bonding wire connecting a bonding ball to an exterior lead and the step of removing the lead comprises the step of removing the bonding wire and the exterior lead.

The step of removing an upper portion of the integrated circuit comprises removing an upper portion of the bonding ball to provide a flattened bonding location at the position of the bonding ball.

The tested integrated circuit package provided may be a thin small outline integrated circuit package (TSOP), and may be a packaged flash memory integrated circuit. The method, however, would work for any plastic encapsulated device so long as the die inside is wire bonded (e.g. a ball grid array style package). The method is independent of die function and would work equally well with other die types including, for example, SDRAM, SRAM, or a processor.

In particular the step of removing an upper portion of the integrated circuit package comprises the step of grinding away the upper portion of the integrated circuit package, and the step of removing the lead comprises dicing the thinned integrated circuit package to leave a framed die.

The invention also expressly contemplates including within its scope the known good die which is produced by the above method.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 1:
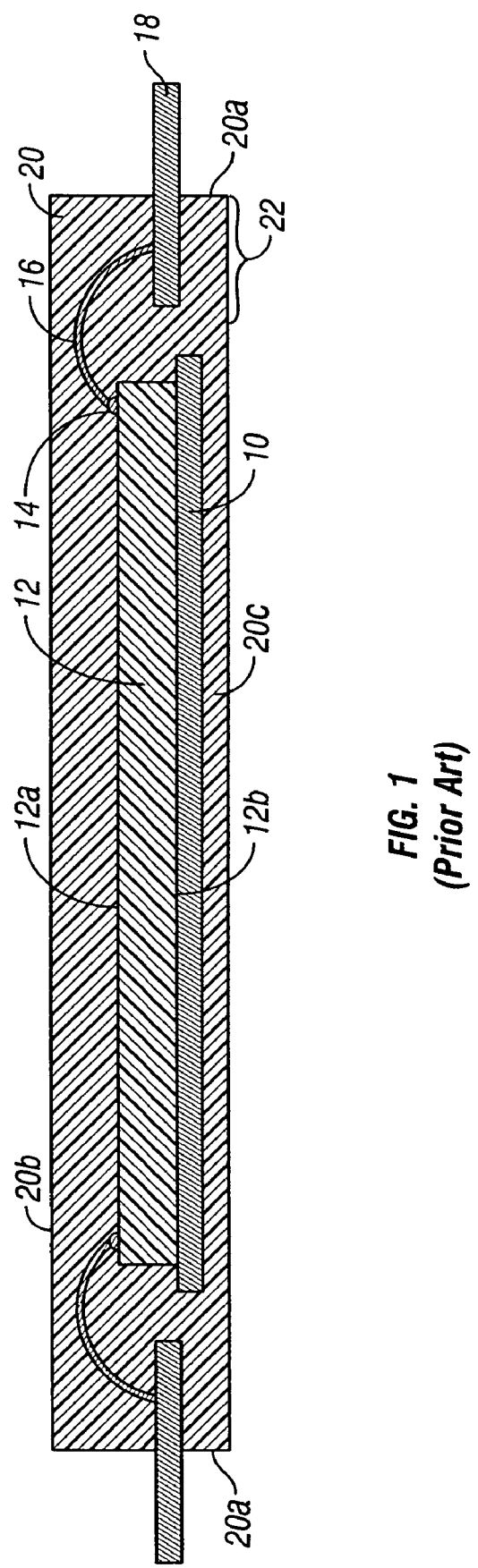
FIG. 1 is a side cross-sectional diagrammatic view of a prior art TSOP memory packaged integrated circuit.

Integrated circuits are readily available in pretested plastic encapsulated packages, and particularly in thin small outline packages (TSOP). Therefore, according to the present invention a method is performed which is comprised of providing a finished or complete TSOP as shown in FIG. 1. The finished or complete TSOP will be a comprehensively tested, packaged, integrated circuit of the type which is readily commercially available.

FIG. 1 is a diagrammatic side cross-sectional view of a typical TSOP, which is comprised of a chip carrier 10 on with a chip 12 is disposed. Chip 12 is shown as a flash memory chip in the illustrated embodiment, but may in fact be any kind of chip now known or later devised. Chip 12 has one or more active or passive semiconductor devices disposed in or on it which are directly or indirectly coupled in an operative manner to one or more bond balls 14, which are metal or conductive balls or bosses connected to contact pads on chip 12. Typically, there is a plurality of bond balls 14 on or near the periphery of the upper surface 12a of chip 12. These bond balls 14 are then typically wire bonded by thin wires 16 to leads 18. The entire ensemble is potted or packaged in a passivating encapsulation, usually insulative plastic packaging 20. Leads 18 extend through and out of packaging 20 to allow convenient exterior electrical connection to the devices in chip 12. Leads 18 are shown in FIG. 1 as extending through the lateral walls 20a of packaging 20, but it is to be expressly understood that the leads may extend downwardly after emerging from lateral walls 20a or may extend through the upper or lower surfaces of packaging 20 as well. Any lead topology now known or later devised may be equivalently employed in the invention.

The method continues with the step of grinding or removing the top surface 20b of packaging 20 down to the level of bond balls 14. This step will result in the removal of all portions of wire 16 connected to bond ball 14. Thereafter, a metal contact pad 24 is lithographically disposed on ground bond balls 14. The back or lower surface 20c of packaging 20 as shown in FIG. 1 is then ground down or removed to exposed or nearly expose the bare silicon backside 12b of chip 12. The side portions 22 of packaging 20 are also ground away, diced or removed taking leads 18 and any remaining portion of wire 16 leaving only a small amount of plastic encapsulation 20 laterally around chip 12. The manner in which material is removed is to be broadly understood to include grinding, sawing, cutting, fracturing, etching, ablating or any other means now known or later devised for trimming or thinning integrated circuit packages.

Figure 2:
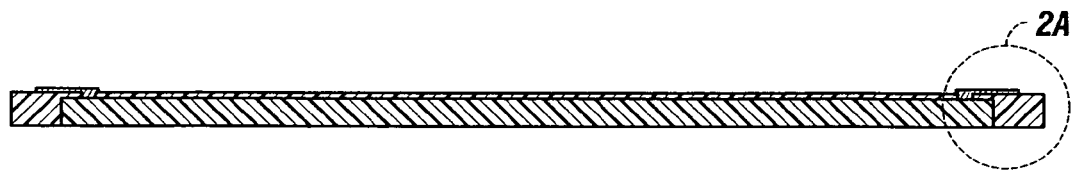
FIG. 2 is an enlarged side cross-sectional diagrammatic view of one end of the TSOP memory packaged integrated circuit after it has been modified by the methodology of the invention to provide a known good die.
Figure 2A:
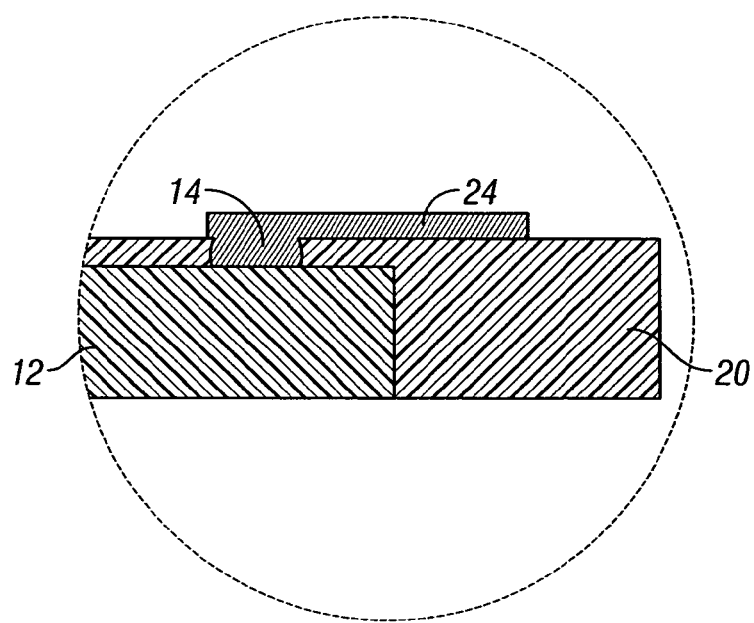

As shown in enlarged side cross-sectional view of one end of the modified TSOP in FIG. 2, what results is essentially a bare chip 12 with contact pads 24 provided for each bond ball 14 framed by a thin rim of encapsulating material 20 wherein chip or die 12 has prior to all the above steps been tested to determine its operability as intended. The KGD problem is thus solved.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

I claim:

1. A method for fabricating a known good die comprising:
providing a tested integrated circuit package including a die having at least one contact pad disposed on an upper surface of the die, a corresponding bond ball connected to the contact pad, and a corresponding lead connected to the bond ball, wherein the die, the bond ball and the lead are encapsulated within packaging material with the lead extending out through the packaging material;
removing an upper portion of the packaging material to expose the bond ball, wherein the remainder of the upper surface of the die is covered by the packaging material; and
removing the lead and a portion of the packaging material containing the lead.

2. The method for fabricating a known good die according to claim 1, wherein the fabrication process further comprises removing a lower portion of the packaging material to expose a backside of the die.

3. The method for fabricating a known good die according to claim 1, wherein the fabrication process further comprises removing an upper portion of the bond ball to provide a flattened bonding location.

4. The method for fabricating a known good die according to claim 3, wherein the fabrication process further comprises disposing a contact pad on the flattened bonding location.

5. The method for fabricating a known good die according to claim 4, wherein the contact pad on the flattened bonding location is disposed lithographically.

6. The method for fabricating a known good die according to claim 4, wherein the contact pad on the flattened bonding location is partially disposed on the packaging material.

7. The method for fabricating a known good die according to claim 1, wherein the tested integrated circuit package comprises a thin small outline integrated circuit package (TSOP).

8. The method for fabricating a known good die according to claim 1, wherein the tested integrated circuit package comprises a packaged flash memory integrated circuit.

9. The method for fabricating a known good die according to claim 1, wherein the tested integrated circuit package comprises a thin small outline packaged (TSOP) flash memory integrated circuit.

10. The method for fabricating a known good die according to claim 1, wherein the bond ball and the lead are connected using a bonding wire, and wherein the bonding wire and the packaging material containing the bonding wire are removed from the integrated circuit package.

11. The method for fabricating a known good die according to claim 1, wherein the lead and the portion of the packaging material containing the lead are removed by dicing the integrated circuit package, and wherein a layer of packaging material is left on the lateral surfaces of the die.

12. The method for fabricating a known good die according to claim 1, wherein the packaging material is removed from the integrated circuit package by grinding the packaging material.

* * * * *

UNITED STATES PATENT AND TRADEMARK OFFICE
CERTIFICATE OF CORRECTION

PATENT NO. : 7,174,627 B2  
APPLICATION NO. : 10/338974  
DATED : February 13, 2007  
INVENTOR(S) : Keith D. Gann Page 1 of 1

It is certified that error appears in the above-identified patent and that said Letters Patent is hereby corrected as shown below:

ON THE TITLE PAGE ITEM (56)

In the "References Cited" section, insert

--FOREIGN PATENT DOCUMENTS  
EP 0 668 661 A1 8/1995 (EP)--.

Signed and Sealed this

Twentieth Day of January, 2009

JON W. DUDAS  
*Director of the United States Patent and Trademark Office*